US009653625B2

(12) United States Patent
Myoung et al.

(10) Patent No.: US 9,653,625 B2
(45) Date of Patent: May 16, 2017

(54) METHOD FOR MANUFACTURING ANTI-REFLECTIVE COATING FOR SOLAR CELL HAVING MOTH-EYE STRUCTURE AND SOLAR CELL INCLIDING THE SAME

(75) Inventors: Jae Min Myoung, Goyang si (KR); Beom Ki Shin, Seoul (KR); Tae Il Lee, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 745 days.

(21) Appl. No.: 14/123,808

(22) PCT Filed: Dec. 15, 2011

(86) PCT No.: PCT/KR2011/009644
§ 371 (c)(1),
(2), (4) Date: Dec. 4, 2013

(87) PCT Pub. No.: WO2012/102481
PCT Pub. Date: Aug. 2, 2012

(65) Prior Publication Data
US 2014/0166101 A1    Jun. 19, 2014

(30) Foreign Application Priority Data
Jan. 25, 2011 (KR) .......................... 10-2011-007118

(51) Int. Cl.
*H01L 31/0216* (2014.01)
*H01L 31/0236* (2006.01)

(52) U.S. Cl.
CPC .. *H01L 31/02168* (2013.01); *H01L 31/02363* (2013.01); *H01L 31/02366* (2013.01); *Y02E 10/50* (2013.01)

(58) Field of Classification Search
CPC ......... H01L 31/02168; H01L 31/02363; H01L 31/02366; Y02E 10/50
See application file for complete search history.

(56) References Cited

U.S. PATENT DOCUMENTS

2009/0188557 A1    7/2009  Wang
2009/0253227 A1   10/2009  Defries

FOREIGN PATENT DOCUMENTS

KR    10-0953388    4/2010

OTHER PUBLICATIONS

Shin et al., "Bottom-up grown ZnO nanorods for an antireflective moth-eye structure on CuInGaSe2 solar cells", Sep. 2011.*

* cited by examiner

*Primary Examiner* — Matthew Martin
(74) *Attorney, Agent, or Firm* — Lex IP Meister, PLLC (57) ABSTRACT

A method of manufacturing antireflective coating for solar cell having a moth-eye structure and a solar cell including the same are provided to greatly reduce reflectivity by forming an antireflective coating layer having a moth-eye structure on an upper electrode layer of the solar cell using a bottom-up method. A bottom electrode layer is formed on a substrate. A photoreactive layer is formed on the bottom electrode layer. The photoreactive layer is made of CIS (Copper, Indium, Selenide) materials. A buffer layer is formed on the photoreactive layer. A ZnO layer is formed on the buffer layer. A top electrode layer is formed on the ZnO layer.

7 Claims, 11 Drawing Sheets

METHOD FOR MANUFACTURING ANTI-REFLECTIVE COATING FOR SOLAR CELL HAVING MOTH-EYE STRUCTURE AND SOLAR CELL INCLIDING THE SAME

BACKGROUND OF THE INVENTION

Field of the Invention

The present invention relates to a method of manufacturing an anti-reflective (AR) coating for a photovoltaic cell, and more particularly, to a method of manufacturing an AR coating having a moth-eye structure which can prevent surface reflection and a photovoltaic cell including the same AR coating.

Description of Related Art

Figure 1:
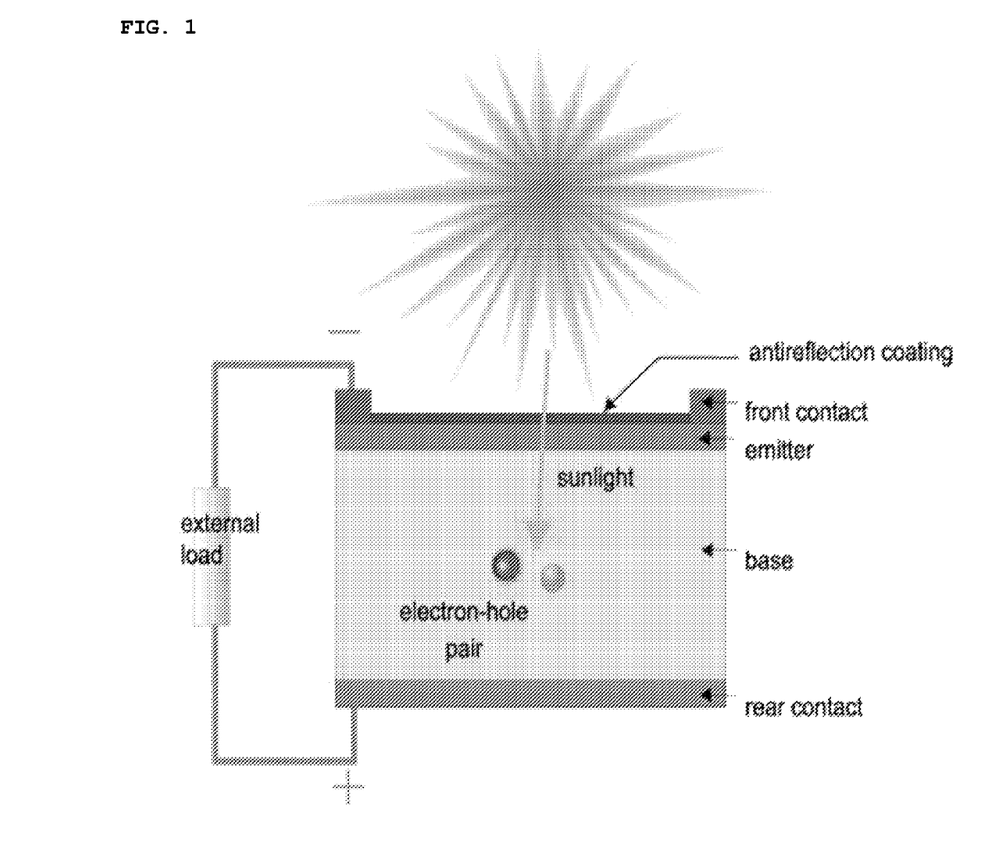
FIG. 1 is a view schematically showing the structure of a typical photovoltaic cell of the related art.

A photovoltaic cell is a device that generates electrical energy by absorbing photons from the sun. FIG. 1 schematically shows a known photovoltaic cell structure. In a two-terminal junction device such as a p-n diode or a Schottky diode, which is a typical photovoltaic cell topology, electricity is generated as follows: Photons produce electron-hole pairs (excitons), which must be spontaneously divided toward both ends of the device. Before producing excitons, photons always experience blockage at the interface between air (refractive index n=1) and a window layer (n>1) of the device due to different refractive indices of the air and the window layer. This phenomenon of photon blockage referred to as surface reflection is one of well-known light loss factors in solar energy harvesting.

In order to reduce such surface reflection, as shown in FIG. 1, an anti-reflective (AR) coating is formed. At the same time, many strategies for reducing the reflection of light on the surface of a photovoltaic cell, such as deposition of a thin film having an intermediate refractive index, micro-texturing, or induction of surface plasmonic scattering using metallic nanoparticles, were proposed. In 1967, Bernard discovered the moth's cornea in which conical protuberances are uniformly arrayed. This structure was suggested as a final solution to prevent surface reflection over the whole solar radiation spectrum. The optical actions of the corneal nipple not only reduce the reflectance of the facet lens surface, but also increase the photosensitivity of the facet lens surface. The height of the nipple was proved a more essential factor than the function of the width of the nipple. The top width of the nipple was proved to be more effective than the bottom width of the nipple when reducing the reflectance.

Recently, as methods for realizing an AR structure having a large area moth-eye structure on a photovoltaic cell, top-down processes such as photolithography, nano-imprinting lithography and nano-laser interference lithography were reported. However, none of these top-down processes are successful unless the surface of a substrate is flattened, because it is difficult to coat a non-flattened surface with a lithography medium such as a photo-reactive layer. Potential materials for a thin-film photovoltaic cell include CuInGaSe$_2$ (CIGS), a-Si and CdTe, in which a CIGS photovoltaic cell achieved the highest conversion efficiency (up to about 20%) due to its excellent light absorbance. It is important to increase the grain size of the CIGS layer when it is intended to achieve a high efficiency in the CIGS photovoltaic cell because a reduction in the grain boundary area also leads to a reduction in electron-hole recombination at the grain boundary. Unfortunately, as the grain size of the CIGS layer increases, the surface roughness condition makes it difficult to perform the top-down process. Accordingly, there has been no report on the application of an AR coating having a moth-eye structure to the CIGS photovoltaic cell.

BRIEF SUMMARY OF THE INVENTION

Various aspects of the present invention provide a method of forming an anti-reflective (AR) coating having a moth-eye structure on a photovoltaic cell in a bottom-up fashion instead of a top-down fashion and a photovoltaic cell including the same AR coating.

Also provided is a method of forming a high-transmittance and low-reflectance AR coating having a moth-eye structure on a photovoltaic cell without being interfered by the surface shape unlike in the related art in which the AR coating having a moth-eye structure cannot be formed on an essentially irregular surface in the top-down fashion. Also provided is a photovoltaic cell, in particular, a CuInGaSe$_2$ (CIGS) photovoltaic cell including the same AR coating.

Also provided is a method of forming an AR coating having a moth-eye structure at an inexpensive cost using a low-temperature process such that the AR coating can be deposited on a large area. Also provided is a CIGS photovoltaic cell including the same AR coating.

In order to realize the above object, an aspect of the present invention provides a method of forming an AR coating for a CIS-based photovoltaic cell. The CIS-based photovoltaic cell includes a substrate, a lower electrode layer formed on the substrate, a photo-reactive layer formed on the lower electrode layer and made of a CIS-based material, a buffer layer formed on the photo-reactive layer, a ZnO layer formed on the buffer layer to act as a window, and an upper electrode layer formed on the ZnO layer. The method includes the steps of: vertically dipping the photovoltaic cell into a reaction chamber containing a reactive compound that reacts with the upper electrode layer; sealing the reaction chamber; heating the reaction chamber to cause a hydrothermal reaction, thereby growing nano-rods having a moth-eye structure on the upper electrode layer in a bottom-up fashion to thus form the AR coating.

According to an embodiment, the upper electrode layer may act as a seed layer of the nano-rods.

According to an embodiment, the upper electrode layer may be made of aluminum-doped ZnO (AZO), and the reactive compound may be made by mixing zinc nitrate hexahydrate (Zn(NO$_3$)$_2$6H$_2$O) and hexamethylenetetramine (C$_6$H$_{12}$N$_4$) in an aqueous solution.

According to an embodiment, the ZnO nano-rods may grow as Zn(OH)$_2$ precipitates are formed in the aqueous solution during the hydrothermal reaction and then ZnO nanoparticles created from the Zn(OH)$_2$ precipitates are accumulated and dispersed on the seed layer.

According to an embodiment, a shape of end tips of the nano-rods of the moth-eye structure may be adjusted by controlling a reaction time when performing the hydrothermal reaction.

According to an embodiment, the nano-rods having conical end tips may be grown by controlling the reaction time of the hydrothermal reaction to be about 1.5 hours.

According to an embodiment, the nano-rods having flat end tips may be grown by controlling the reaction time of the hydrothermal reaction to be about 3 hours.

Another aspect of the present invention provides a CIS-based photovoltaic cell that includes a substrate, a lower electrode layer formed on the substrate, a photo-reactive layer formed on the lower electrode layer and made of a CIS-based material, a buffer layer formed on the photo-reactive layer, a ZnO layer formed on the buffer layer to act as a window, an upper electrode layer formed on the ZnO layer, and nano-rods having a bottom-up moth-eye structure grown on a surface of the upper electrode layer.

According to an embodiment, the surface of the upper electrode layer has a non-flattened surface shape.

According to an embodiment, the upper electrode layer may be made of aluminum (Al)-doped ZnO (AZO).

According to an embodiment, the nano-rods of the moth-eye structure may have conical end tips.

According to an embodiment, the nano-rods of the moth-eye structure may have flat end tips.

According to embodiments of the invention, unlike the related art, an AR coating layer having a moth-eye structure can be formed in a bottom-up fashion on an upper electrode layer of a photovoltaic cell irrespective of the surface shape of the upper electrode layer, thereby significantly reducing reflectance.

DETAILED DESCRIPTION OF THE INVENTION

Reference will now be made in detail to various embodiments of the present invention with reference to the accompanying drawings. In the following description of the present invention, detailed descriptions of well-known technological components, terms or the like will be omitted. In particular, descriptions of a general structure, function or the like of a CIGS photovoltaic cell will be omitted since they are well known in the art. Although such descriptions are omitted, the following embodiments will enable a person skilled in the art to easily understand the characteristic features of the present invention from the following description of the present invention.

Figure 2A:
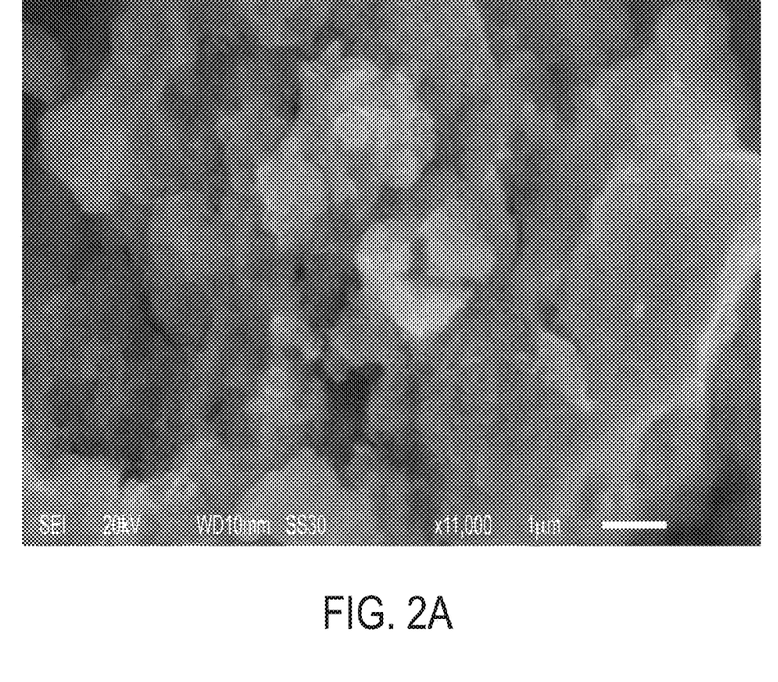
FIG. 2 shows a microscopic picture showing the cross-sectional structure of a CIGS photovoltaic cell according to an embodiment of the present invention, and schematically shows the surface shape of an upper electrode layer and ZnO nano-rods having a moth-eye structure which are grown on the surface of the upper electrode layer in a bottom-up fashion according to an embodiment of the present invention.

As shown in FIG. 2(a), a CIGS photovoltaic cell according to an embodiment of the invention has a multilayer structure of Al-doped ZnO (AZO)/i-ZnO/CdS/CIGS/Mo on a soda-lime glass substrate. The Mo electrode (lower electrode layer) composed of bilayers (40 nm/460 nm) was deposited using a direct current (DC) magnetron sputtering system. The CIGS layer was formed by downward co-evaporation technique. Specifically, a CIGS crystalline thin film was formed by downward ejection of Cu, Ga, In and Se gases, and the glass was maintained at 550° C. during the deposition process. The CIGS layer was formed by linearly moving the glass since an evaporation source was a linear source. The thickness of the CIGS layer was 1700 nm, and the composition ratio of Cu:In:Ga:Se measured by X-ray fluorescence analysis was 24:17:7:52(%). The CdS layer (buffer layer) was deposited by chemical surface deposition. That is, a thickness of 80 nm was obtained by performing a CdS wet process twice, and the glass was heated to 70° C. during the processing. The i-ZnO layer was deposited to a thickness of 100 nm using a radio-frequency (RF) magnetron sputter. The AZO layer (upper electrode layer) was deposited to a thickness of 800 nm using a DC magnetron sputter.

As shown in FIG. 2(a), the surface of the microscopic structure of the AZO layer, the outermost layer of the CIGS photovoltaic cell, is rough rather than smooth. Therefore, as described in conjunction with the related art, it is impossible to form an anti-reflective (AR) coating having a moth-eye structure with a superior anti-reflection effect on the AZO layer in the top-down fashion using lithography or the like.

Figure 2B:
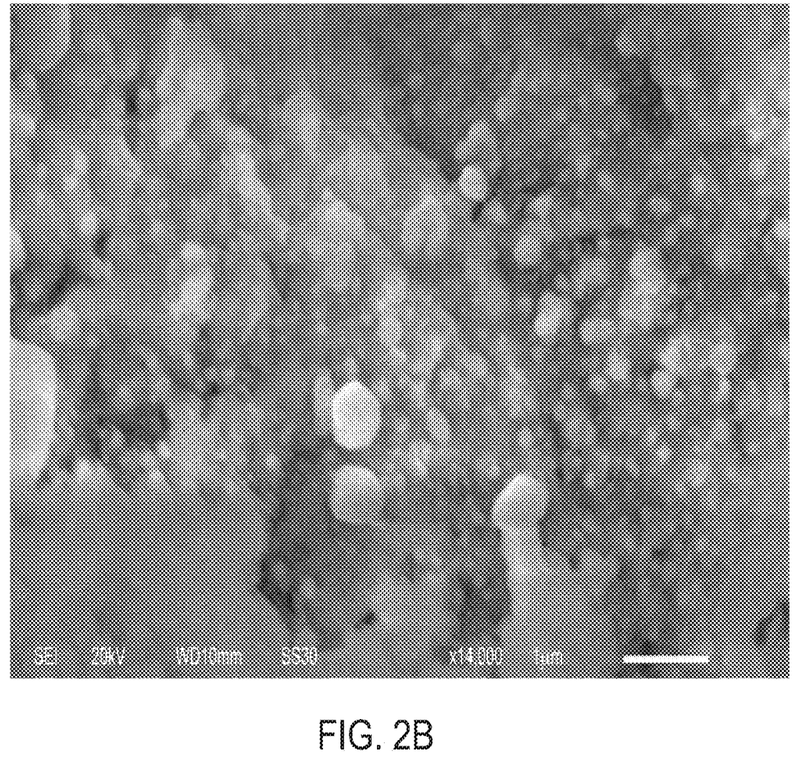
Figure 2C:
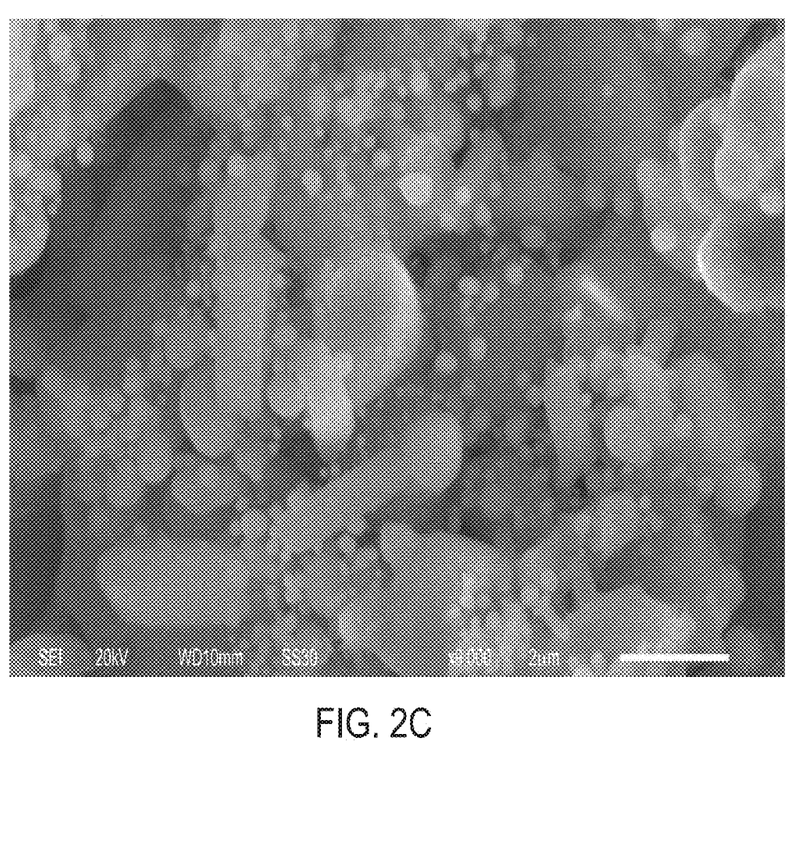

In order to realize the moth-eye structure on the top surface of the above-mentioned CIGS photovoltaic cell, the inventors grew ZnO nano-rods using a hydrothermal process as will be described in detail hereinafter. Although the moth-eye-mimicking structure of the ZnO nano-rods was conical, flat nano-rods were also manufactured in order to identify the distinct AR features thereof with those of the conical ZnO nano-rods. (Details will be described later.) The schematic cross-sectional shapes of the ZnO nano-rods on the rough AZO film induced by micro-scale grains of the CIGS layer are shown in FIG. 2B.

In general, in order to realize an effective AR structure that has maximum transmittance and minimum reflectance without diffraction or scattering loss, the following conditions should be fulfilled.

(1) The height h of the conical region of the ZnO nano-rods must be equal to at least 40% of the longest operational wavelength $\lambda$: $h \geq 0.4\lambda$.

(2) The center-to-center spacing $\Lambda$ of the ZnO nano-rods must be smaller than shortest operational wavelength divided by the refractive index n of the material: $\Lambda < \lambda/n$

(3) When a high refractive index material having conical protuberances is used, the refractive index must increase non-linearly. In contrast, when a material having a low refractive index is used, the refractive index must increase linearly.

Figure 3:
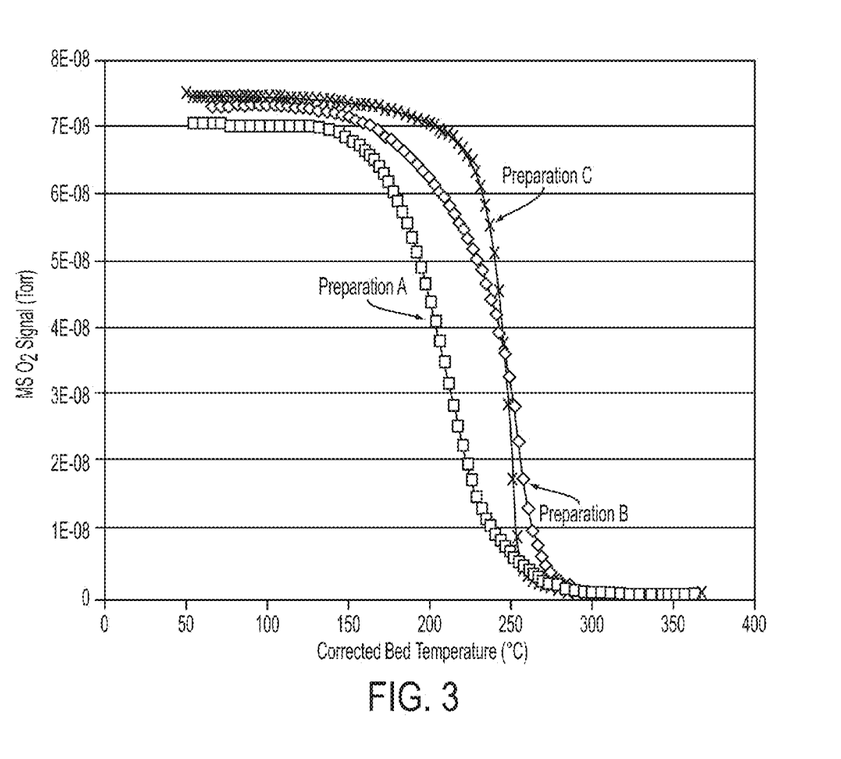
FIG. 3 is a view schematically showing that ZnO nano-rods are grown on an upper electrode layer of a CIGS photovoltaic cell using a hydrothermal reaction according to an embodiment of the present invention.

In order to design the shape of the ZnO nano-rods for the AR coating of a photovoltaic cell, the above-mentioned criteria were considered. First, as schematically shown in FIG. 3, the inventors prepared a reaction chemical by mixing 0.01 M zinc nitrate hexahydrate ($Zn(NO_3)_2 6H_2O$, Aldrich) and 0.01 M hexamethylenetetramine ($C_6H_{12}N_4$, HMT, Aldrich) in an aqueous solution using the top layer of a bare CIGS photovoltaic cell, i.e. an AZO film, as a seed layer. Afterwards, bare CIGS photovoltaic cells were immersed vertically in this solution, reaction bottles containing the solution and bare CIGS photovoltaic cells was sealed, and the sealed reaction bottles were heated to 95° C. (hydrothermal reaction). After the growth was finished, all samples were repeatedly washed with deionized water to eliminate residual salt, and then slowly dried in a hood system at room temperature, finally forming ZnO nano-rods.

The growth process of ZnO through the hydrothermal reaction can be divided into nucleation and crystal growth, which are influenced by combined external factors. Actual nucleation is performed by crystal fractal aggregates and continuous dispersion thereof. At the early stage of crystal growth, the overall size of crystal aggregates is more influenced than the surface shape. At the state where ZnO is actually grown, the progress of dispersion determines the overall size and surface shape as the densities of reactants decrease. Accordingly, the reaction time and the densities of reactants are key factors of the size and surface shape of the ZnO nano-rods.

In the hydrothermal process, two characteristics can be observed depending on the growth environment. First, nuclei homogeneously grow in the inner homogeneous material state. Therefore, the diameter and the degree of dispersion of nuclei in an aqueous solution are determined freely, and the density and size of created nuclei determine the growth and shape, so that various shapes of ZnO nanostructures can be formed. Second, at the presence of a seed layer, ZnO nanoparticles are accumulated on the seed layer and act as nuclei, so that ZnO continuously disperse on the seed layer. In addition, ZnO grows under the influence of the crystallographic characteristic of the seed layer. The growth of ZnO in an aqueous solution is started as white $Zn(OH)_2$ precipitates are formed, and is performed according to the following chemical reactions:

$(CH_2)_6N_4 + 6H_2O \leftrightarrow 6HCHO + 4HN_3$ $NH_3 + H_2O \leftrightarrow NH_4^+ + OH^-$ $2OH^- + Zn^{2+} \leftrightarrow Zn(OH)_2 \leftrightarrow ZnO(s) + H_2O$ In the above-mentioned hydrothermal process, HMT acts as a template for ZnO nucleation, a surfactant and passivation layer, an ammonium-hydroxide source and a condensation agent. The densities of $Zn^{2+}$ and OH have an effect on the size of the ZnO nano-rods, and growth time is a key factor in controlling the shape of the nano-rods. Therefore, in order to control the shape of the ZnO nano-rods, the growth time was varied from 1.5 to 3 hours as an experimental variable at fixed densities.

The morphologies of the ZnO nano-rods formed on the AZO layer in the above-mentioned hydrothermal process were observed using a field emission scanning electron microscope (FESEM, JSM-7001F, JEOL). The diameter and length of the ZnO nano-rods were estimated from the FESEM morphological images using graphical measurement tools. In order to characterize the performances of the AR coatings on the CIGS photovoltaic cells, absolute hemispherical reflectance measurement was performed over the ultraviolet (UV)-visible range (200 to 800 nm) using Cary 500 UV-VIS-NIR Spectrophotometer (Varian) having an integrating sphere. The performances of the photovoltaic cells were measured under simulated sunlight produced at one fixed solar condition using a full spectrum solar simulator (91160A, Oriel Newport) and a reference photovoltaic cell SRC-1000-TC-QZ-N (VLSI standards incorporated, Oriel Newport).

Figure 4A:
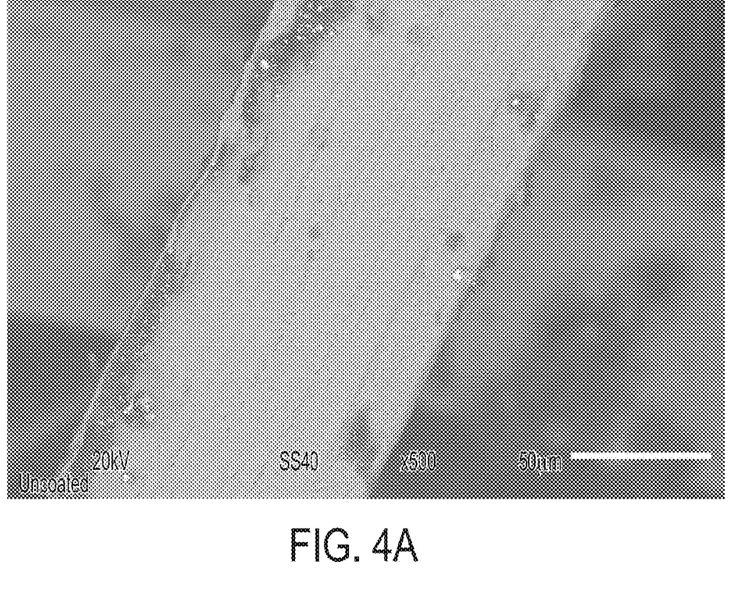
FIG. 4 is a microscopic picture showing the AZO surface shape of a CIGS photovoltaic cell, which shows ZnO nano-rods grown on the surface of the CIGS photovoltaic cell according to an embodiment of the present invention, in which the peak shape of the nano-rods can be controlled through adjustment of a reaction time.
Figure 4B:
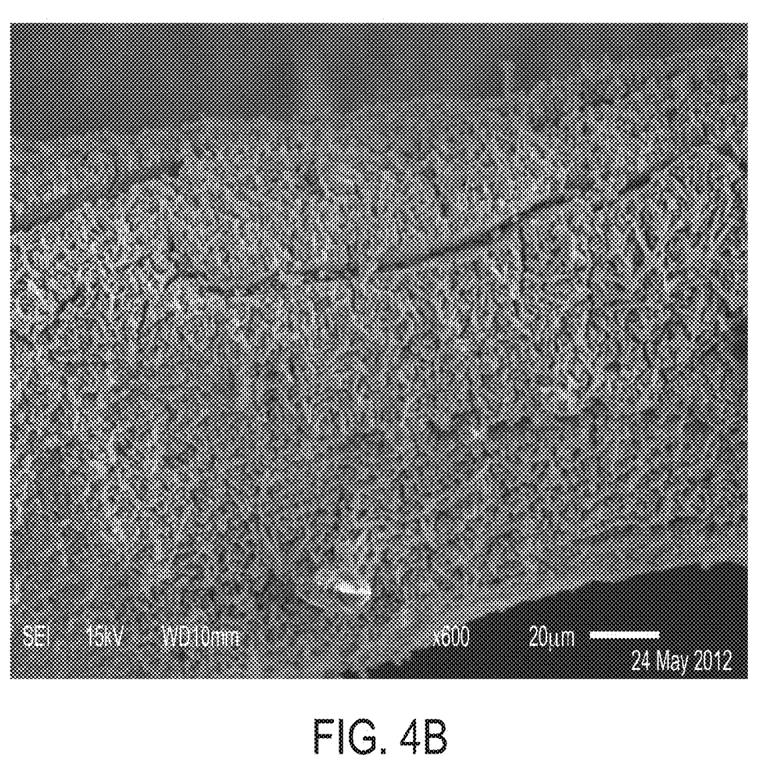
Figure 4C:
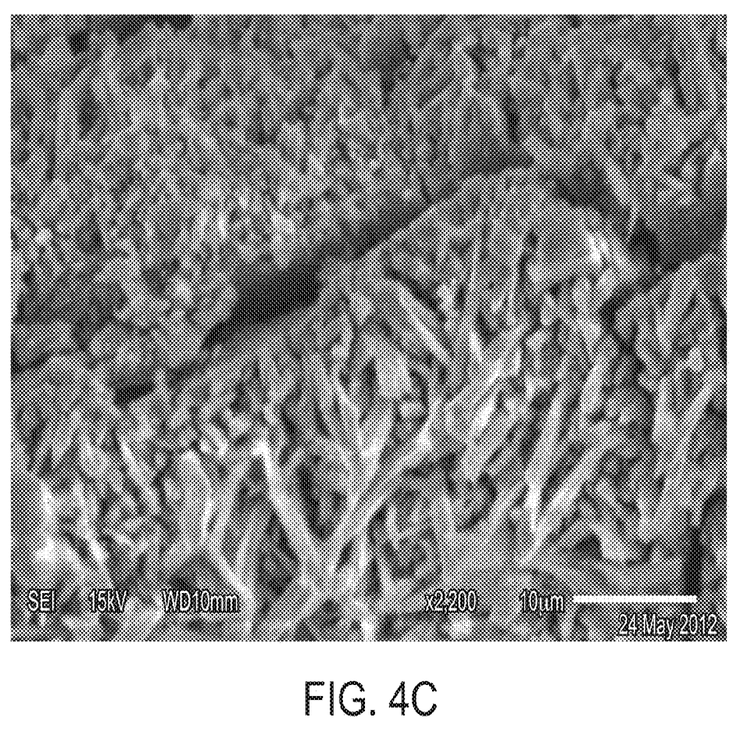

The surface morphology of a bare CIGS photovoltaic cell is shown in FIG. 4A. The AZO top layer exhibited a bumpy structure having micro-scale roughness due to the large grain growth of CIGS. After the above-mentioned hydrothermal process was performed on the bare CIGS photovoltaic cell, two kinds of ZnO nano-rods vertically grown on bumpy AZO films were observed (see FIG. 4B and FIG. 4C). The two nano-rod structures differed in the shape of end tips. Growth for 1.5 hours led to conical nano-rods in which cones had uniform and sharp end tips and the height thereof was about 250 nm (see FIG. 4B). On the other hand, after being grown for 3 hours, the shape of the end tips of the nano-rods was completely flat (see FIG. 4C). Both structures exhibited a similar average height of about 400 nm and a diameter of about 200 nm. However, the diameter of the nano-rods indicates the spatial difference between a valley and a hillock in the bumpy structure. Two mechanisms were thought to be the reasons for this phenomenon: The first reason is the difference in the grain sizes of the AZO thin films due to the inflection polarity of the surface. The second reason is non-uniform distribution of a precursor throughout the valley and hillock regions during the growth of the nano-rods.

Figure 5:
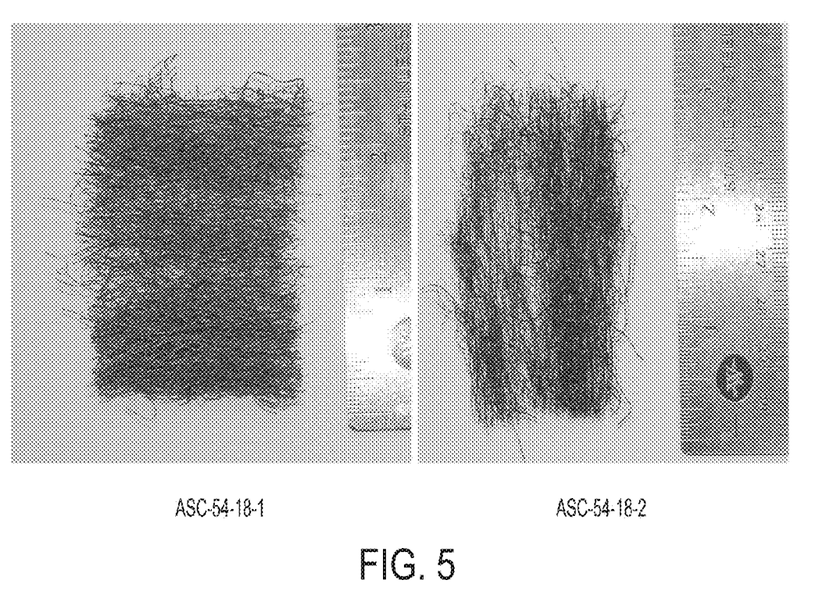
FIG. 5 is a graph showing the reflectances of a bare CIGS photovoltaic cell as well as CIGS photovoltaic cells on which AR coating layers having flat and conical ZnO nano-rod structures are formed according to an embodiment of the present invention.

In order to evaluate the performance of the formed AR coating, reflection was measured over the UV-visible range (200 to 800 nm) using the above-mentioned absolute hemispherical reflectance measurement system. As shown in FIG. 5, the average reflectance of the bare CIGS photovoltaic cell in the UV-visible range was 6.14%. The values of the AR performance were similar to those of crater morphologies induced by wet-etched ZnO films. On the other hand, the average reflectances of the CIGS photovoltaic cell coated with the flat and conical ZnO nano-rods were 2.58% and 1.46%. Noticeably, the reflectance of the bare CIGS photovoltaic cell in the blue wavelength range was almost 8% due to the relatively higher refractive index in this range in comparison to the refractive index in the red wavelength range. However, after being coated with the flat and conical ZnO nano-rods according to the invention, the reflectances were reduced over the entire wavelengths. It is though that the reflectance characteristics of the CIGS photovoltaic cell coated with the ZnO nano-rods are irrelevant to the angle of incidence. The reflectance spectra of the bare CIGS photovoltaic cell exhibited interference fringes of 1% intensity. In contrast, in the spectra of the photovoltaic cells coated with the ZnO nano-rods, no interference fringes were observed. It was confirmed that the length of the ZnO nano-rods formed according to the invention is appropriate for the AR coatings of the CIGS photovoltaic cells. The CIGS photovoltaic cell coated with the conical ZnO nano-rods is also expected to have an omnidirectional AR characteristic like moth eyes. The inserted images in FIG. 5 respectively indicate the photographic colors of the CIGS photovoltaic cells. The color of the bare CIGS photovoltaic cell is gray. After the bare CIGS photovoltaic cell was covered with the ZnO nano-rods, the surface color thereof was changed to black. In the case of the CIGS photovoltaic cell having the conical ZnO nano-rods, the surface color thereof became completely black due to the lowest total reflectance of 1.46%.

Figure 6:
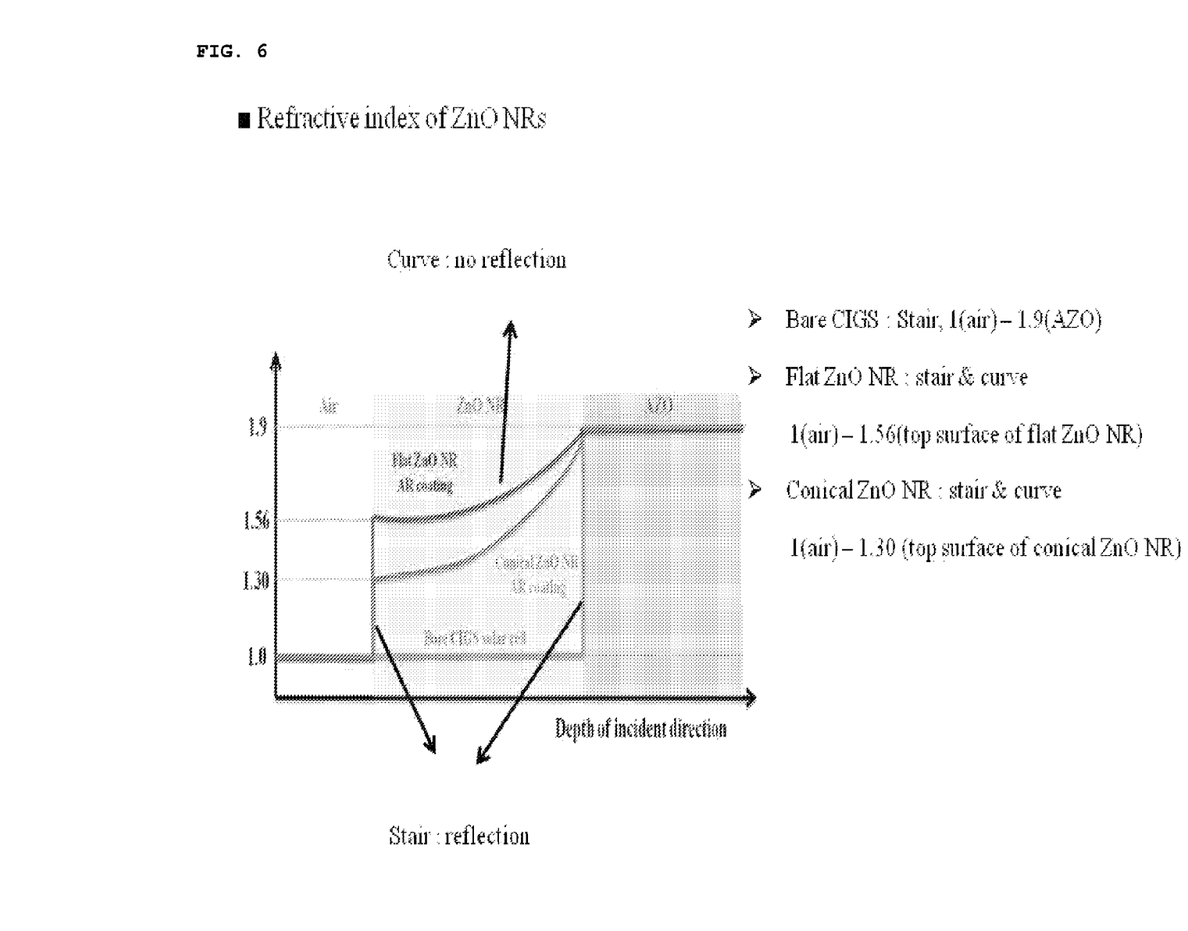
FIG. 6 is a graph showing the refractive index profiles of a bare CIGS photovoltaic cell as well as CIGS photovoltaic cells on which AR coating layers having flat and conical ZnO nano-rod structures are formed according to an embodiment of the present invention.

The refractive index profiles of the respective cases are shown in FIG. 6. The sizes of the respective structures were roughly estimated from the SEM images in FIG. 4. The refractive index profile having the shape of a single-step stair from the air (n=1) to the AZO layer (n=1.9) was determined for the bare CIGS photovoltaic cell. However, in the refractive index profiles for both the AR coatings having the flat and conical nano-rods, there are two distinct tendencies, i.e. stair and curved tendencies, because the refractive index of a porous space consisting of inclined ZnO nano-rods is not constant but rather gradually changes along the light incident axis. The starting values of this change of the refractive index were estimated to be 1.56 and 1.5 for the flat and conical AR coatings (see FIG. 6). From the refractive index profiles shown in FIG. 6, the reflectance converges to zero (0) in the range where the refractive index changes continuously, and is limited at two interfaces where the refractive indices change abruptly and discontinuously.

Figure 7:
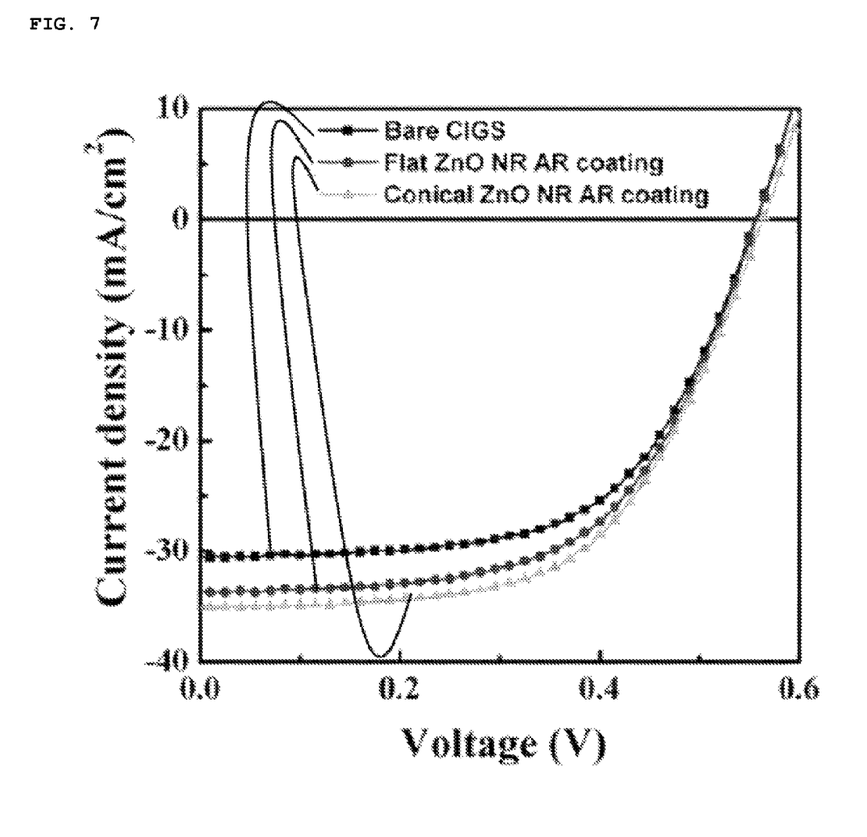
FIG. 7 is a graph showing J-V curves of a bare CIGS photovoltaic cell as well CIGS photovoltaic cells on which AR coating layers having flat and conical ZnO nano-rod structures are formed according to an embodiment of the invention.

FIG. 7 shows the J-V curves of CIGS photovoltaic cells. The parameters are summarized in Table 1 below.

TABLE 1

Parameters of CIGS photovoltaic cells having flat and conical ZnO nano-rod AR coatings in comparison to a bare CIGS photovoltaic cell

| Samples | Reflectance (%) | Jsc (mA/cm$^2$) | Voc (V) | FF | H (%) |
|---|---|---|---|---|---|
| Bare CIGS | 6.14 | −30.1 | 0.56 | 0.59 | 10 |
| AR coating having Flat ZnO nano-rods | 2.58 | −33.7 | 0.56 | 0.58 | 10.9 |
| AR coating having Conical ZnO nano-rods | 1.46 | −35 | 0.56 | 0.58 | 11.5 |

The bare CIGS photovoltaic cell exhibited a conversion efficiency η of 10% at an open-circuit voltage $V_{OC}$ of 0.56V, a short-circuit current density $J_{SC}$ of 30.1 mA/cm$^2$, and a fill factor FF of 59%. The CIGS photovoltaic cells having flat and conical ZnO nano-rod AR coatings exhibited conversion efficiencies η of 10.9% and 11.5% at an open-circuit voltage $V_{OC}$ of 0.56V, short-circuit current densities $J_{SC}$ of 33.7 mA/cm$^2$ and 35 mA/cm$^2$, and a fill factor FF of 58%. From the characteristics of the J-V curves, it is thought that an increase in $J_{SC}$ related to a decrease in the reflectance resulted from an increase in the photovoltaic efficiencies of the CIGS photovoltaic cells having the ZnO nano-rod AR coatings. Therefore, the extra gain in a photocurrent due to an AR effect is given by the following formula:

$$G_p = \frac{\Delta J_{sc}}{J_{sc}} = \frac{J_{sc}(\text{with } ARC) - J_{sc}(\text{without } ARC)}{J_{sc}(\text{without } ARC)}$$

Here, comparative advantages of the modified shape of ZnO nano-rods of the CIGS photovoltaic cells are indicated by extra gains (12% and 16.3%) in the photocurrent $G_p$ for the flat and conical nano-rods due to the decreased reflectance. Consequently, the conversion efficiency η of the photovoltaic cell having the flat ZnO nano-rod AR coating increased from 10% to 10.9%. Moreover, the end tip-controlled ZnO nano-rod AR coating having the conical moth-eye structure led to an increase in the conversion efficiency η of the photovoltaic cell to 11.5% owing to increased $J_{SC}$.

As described above, the bottom-up moth-eye structure is hydrothermally grown through self-organization of ZnO nano-rods. The shape of the ZnO nano-rods is optimized by theoretical calculation in order to obtain a better AR effect for a large CIGS photovoltaic cell having a rough surface. With an increase in growth time, the morphologies of ZnO nano-rods on the AZO layer are converted from a tapered conical shape into a flat shape. Compared to the average reflectance of the bare CIGS photovoltaic cell of 6.14% in the visible range, the reflectances of the photovoltaic cells having the flat and conical ZnO nano-rod AR coatings are 2.58% and 1.46%. With a decrease in the total reflectance, the apparent color of the photovoltaic cell surface changes from gray to black. According to the results of the photovoltaic performances, the efficiencies of the AR coatings having the flat and conical ZnO nano-rods are 10.9% and 11.5% increased from 10% of the efficiency of the bare photovoltaic cell. The comparable advantages of the modified shape of ZnO nano-rods in the CIGS photovoltaic cells are indicated by the $G_p$ levels of 12% and 16.3% for the flat and conical nano-rods due to the decreased reflectance.

Although the present invention has been described hereinabove in conjunction with the exemplary embodiments, it should be understood that the present invention is not limited to the foregoing embodiments. For instance, although the CIGS layer was illustrated as an example of the photo-reactive layer, the photo-reactive layer can be made of CIS, which also belongs to the scope of the present invention. The photo-reactive layer according to the present invention can be collectively referred to as the CIS-based photo-reactive layer. It should be understood that various modifications and alterations are possible within the scope of the appended Claims and all such modifications and alterations fall within the scope of the present invention. Therefore, the present invention shall be defined by only the claims and their equivalents.

The invention claimed is:

1. A method of forming an anti-reflective (AR) coating for a CIS-based photovoltaic cell, the CIS-based photovoltaic cell comprising a substrate, a lower electrode layer formed on the substrate, a photo-reactive layer formed on the lower electrode layer and made of a CIS-based material, a buffer layer formed on the photo-reactive layer, a ZnO layer formed on the buffer layer to act as a window and an upper electrode layer formed on the ZnO layer, the method comprises the steps of:
   vertically dipping the photovoltaic cell into a reaction chamber containing a reactive compound that reacts with the upper electrode layer;
   sealing the reaction chamber, and
   heating the reaction chamber to cause a hydrothermal reaction, thereby growing ZnO nano-rods having a moth-eye structure on the upper electrode layer in a bottom-up fashion to thus form the AR coating.

2. The method according to claim 1, wherein the upper electrode layer acts as a seed layer of the ZnO nano-rods.

3. The method according to claim 2, wherein the upper electrode layer is made of aluminum-doped ZnO (AZO), and the reactive compound is made by mixing zinc nitrate hexahydrate (Zn(NO$_3$)$_2$6H$_2$O) and hexamethylenetetramine (C$_6$H$_{12}$N$_4$) in an aqueous solution.

4. The method according to claim 3, wherein the ZnO nano-rods grow as Zn(OH)$_2$ precipitates are formed in the aqueous solution during the hydrothermal reaction and then ZnO nanoparticles created from the Zn(OH)$_2$ precipitates are accumulated and diffused on the seed layer.

5. The method according to claim 1, wherein a shape of end tips of the ZnO nano-rods having the moth-eye structure is adjusted by controlling a reaction time when performing the hydrothermal reaction.

6. The method according to claim 5, wherein the ZnO nano-rods having the moth-eye structure are grown to have conical end tips by controlling the reaction time of the hydrothermal reaction to be about 1.5 hours.

7. The method according to claim 5, wherein the ZnO nano-rods having the moth-eye structure are grown to have flat end tips by controlling the reaction time of the hydrothermal reaction to be about 3 hours.

* * * * *